(12) United States Patent
Norton et al.

(10) Patent No.: US 7,569,521 B2
(45) Date of Patent: Aug. 4, 2009

(54) METHOD OF PRODUCING BIAXIALLY TEXTURED SUBSTRATES AND RELATED ARTICLES, DEVICES AND SYSTEMS

(75) Inventors: David Paul Norton, Gainesville, FL (US); Seh-Jin Park, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 791 days.

(21) Appl. No.: 11/001,234

(22) Filed: Dec. 1, 2004

(65) Prior Publication Data
US 2006/0116293 A1    Jun. 1, 2006

(51) Int. Cl.
*H01B 12/00* (2006.01)
*H01F 6/00* (2006.01)
*H01L 39/00* (2006.01)

(52) U.S. Cl. ............... 505/237; 505/238; 505/166; 505/211; 505/430; 428/697; 428/698; 428/701; 428/702; 29/599; 174/125.1

(58) Field of Classification Search ......... 505/235–238, 505/230, 330, 430, 472–477; 29/599; 174/125.1; 428/699–701, 430, 930; 438/2
See application file for complete search history.

(56) References Cited

U.S. PATENT DOCUMENTS

| | | | |
|---|---|---|---|
| 4,994,435 A * | 2/1991 | Shiga et al. ............... | 505/232 |
| 5,204,313 A * | 4/1993 | Lelental et al. ........... | 505/446 |
| 5,248,564 A | 9/1993 | Ramesh | |
| 5,650,378 A | 7/1997 | Iijima et al. | |
| 5,739,086 A | 4/1998 | Goyal et al. | |
| 5,872,080 A * | 2/1999 | Arendt et al. ............. | 505/238 |
| 5,964,966 A | 10/1999 | Goyal et al. | |
| 6,190,752 B1 * | 2/2001 | Do et al. ................... | 428/141 |
| 6,849,580 B2 * | 2/2005 | Norton et al. ............. | 505/237 |
| 7,071,149 B2 * | 7/2006 | Selvamanickam ......... | 505/237 |

FOREIGN PATENT DOCUMENTS

WO    WO 02/47119    6/2002

OTHER PUBLICATIONS

Florence, G., Ion-beam-assisted sputter deposition of YSZ buffer layers for superconducting interconnect applications, Supercond. Sci. Technol., 8, 1995, pp. 546-551.

Groves, J.R., et al., High critical current density $YBa_2Cu_3O_{7-\delta}$ thick films using ion beam assisted deposition of MgO bi-axially oriented template layers on nickel-based superalloy substrates, J. Mater. Res., vol. 16, No. 8, Aug. 2001, pp. 2175-2178.

(Continued)

*Primary Examiner*—Stanley Silverman
*Assistant Examiner*—Kallambella Vijayakumar
(74) *Attorney, Agent, or Firm*—Novak Druce + Quigg; Gregory A. Nelson; Gregory M. Lefkowitz (57) ABSTRACT

A biaxially textured article includes a substrate, a first buffer layer disposed on the substrate, the first buffer layer having uniaxial crystal texture characterized by out-of-plane texture with no significant in-plane crystallographic texture. A metal comprising second buffer layer is disposed on the first buffer layer, the second buffer layer having a biaxially textured surface. An electronically active layer, such as a superconductor layer, can be disposed on the second buffer film. Ion-beam assisted processes can be used to biaxially texture the surface of the second buffer film after its deposition.

36 Claims, 7 Drawing Sheets

OTHER PUBLICATIONS

Hoi Hur, C. et al., Fabrication of YBa2Cu307-x superconducting film with Ce02/BaTio double buffer layer, Preparation & Characterization, Elsevier Sequoia, IL, vol. 398-399, pp. 444-447 (Nov. 2001).

Kai, M. et al., Influence of the second buffer layer for alignment of seed film on Ni tape with NiO buffer layer, Physica C, North-Holland Publ., Amsterdam, NL, vol. 378-381 pp. 998-1002 (Oct. 2002).

* cited by examiner

METHOD OF PRODUCING BIAXIALLY TEXTURED SUBSTRATES AND RELATED ARTICLES, DEVICES AND SYSTEMS

CROSS-REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

The invention relates to biaxially textured buffer layers and articles, devices and systems made therefrom, including superconductor wires and tapes.

BACKGROUND OF THE INVENTION

Much of the effort to develop a high temperature superconducting (HTS) wire or tape has focused on coated conductors based on the epitaxial growth of high temperature superconducting (HTS) films on tapes that possess a biaxially-textured surface. Superconducting films with critical current densities in excess of 1 $MA/cm^2$ at 77 K and self-field have been achieved for epitaxial $YBa_2Cu_3O_7$ films on biaxially-textured tapes produced either by ion-beam assisted deposition (IBAD) or thermomechanically-textured metals.

In previous work involving IBAD, the synthesis of the biaxially-textured buffer layer suitable for HTS films capable of carrying high critical current densities has employed the ion-assist process to produce both the in-plane and out-of-plane texture. In order to realize an HTS film possessing a high critical current on a biaxially textured substrate, the buffer layer architecture must satisfy rigorous requirements. The grains within the topmost buffer layer construct must generally provide a common in-plane and out-of-plane crystallographic texture with a mosaic spread of generally less than 20°, with lower mosaic spreads such as less than 10° providing better superconducting articles.

The top layer must also be chemically compatible with the superconductor so as to not react during superconductor deposition and be mechanically robust to prevent microcrack formation at the HTS/buffer layer interface. To date, the only IBAD buffer layers that have met these objectives have required the use of the ion-assist process in determining the in-plane and out-of-plane texture. For example, biaxially textured yttria-stabilized zirconia (YSZ) buffer layer can be formed with the (100) in-plane and (001) out-of-plane texture by directing an Ar+ beam flux oriented 55° from the surface normal, which corresponds to the [111] direction for a (001)-oriented cubic material.

A significant limitation for the above-described IBAD process is that the optimal biaxial texture requires a relatively thick (>1 μm) YSZ film deposited in the presence of the Ar+ beam. This makes the process relatively slow and as a result expensive, which is a significant issue in the large-scale production of superconducting tapes. A second approach involves the IBAD deposition of MgO requires a sub-10 nm control of the nucleation process, typically employing an in-situ monitoring technique, such as reflection high energy electron diffraction, for controlling the crystallographic texture. This approach is difficult to employ for large-scale production. Also, the quality of MgO films deposited by IBAD has been found to be extremely sensitive to minor variations in the processes and structures used for this material.

SUMMARY OF THE INVENTION

A biaxially textured article includes a substrate, a first buffer layer disposed on the substrate, the first buffer layer having uniaxial crystal texture characterized by out-of-plane texture with no significant in-plane crystallographic texture. As used herein, the term "texture", whether referring to in-plane or out-of-plane texture, refers to a grain-to-grain crystallographic misorientation "mosaic spread" of the topmost layer of less than 30 degrees, such as less than 20 degrees, 15 degrees, 10 degrees, or 5 degrees, but is generally finite typically being greater than 1°. The phrase "no significant texture", as used herein, refers to a grain-to-grain misorientation "mosaic spread" of the topmost layer of greater than 30 degrees and includes random polycrystalline arrangements.

Regarding the out-of-plane crystallographic texture, the mosaic spread is generally represented by a full-width-at-half-maximum value of an x-ray diffraction peak, such as obtained by a (001) pole figure measurement. In this case, the (001) crystallographic planes of the grains are aligned and thus textured in a direction perpendicular to the normal to the film within an angular spread of less than 30 degrees.

A metal comprising second buffer layer is disposed on the first buffer layer, the second buffer layer having a biaxially textured surface. The metal comprising second buffer layer is generally a metal or metal alloy. Biaxial texture by definition has both in-plane and out-of-plane crystal texture. A biaxially textured surface or biaxially textured layer is defined herein as a polycrystalline material in which both the crystallographic in-plane and out-of-plane grain-to-grain misorientation of the topmost layer is less than about 30 degrees, such as less than about 20 degrees, 15 degrees, 10 degrees, or 5 degrees, but is generally finite typically greater than about 1°. The degree of biaxial texture can be described by specifying the distribution of grain in-plane and out-of-plane orientations as determined by x-ray diffraction. A full-width-half-maximum (FWHM) of the rocking curve of the out-of-plane ($\Delta\theta$) and in-plane ($\Delta\phi$) reflection can be determined. Therefore, the degree of biaxial texture can be defined by specifying the range of $\Delta\theta$ and $\Delta\phi$ for a given sample.

An electromagnetically or electro-optically active layer, such as a superconductor layer, can be disposed on the biaxially textured surface. Ion-beam assisted processes can be used to biaxially texture the surface of the second buffer film after its deposition.

As used herein, the term "disposed on" is used to refer to the relative location of the elements in an article, and does not necessarily require direct contact between the described elements or components (unless otherwise described as such), and may include intervening layers or films. Accordingly, the term is used in a general sense regarding orientation or location, as generally illustrated in the drawings.

The first buffer film can be aligned along the [001] crystal direction. The out-of-plane crystallographic texture can provide a mosaic spread of no more than 30 degrees. The first buffer film has a rock-salt-like crystal structure. The first buffer film can comprise $REBa_2Cu_3O_7$, $Bi_4Ti_3O_{12}$, MgO, TiN, or NiO, where RE is a rare earth element.

The substrate can comprise a metal alloy. The substrate need not have any significant texture. The biaxially textured surface of the second buffer layer can be aligned along a first axis having along a [001] crystal direction, and along a second axis having a crystal direction selected from the group consisting of [111], [101], [113], [100] and [010]. The second buffer film can be metal having a cubic crystal structure, such as Ni, Cu, Au, Ag, Pd, or related alloys.

The article can include a biaxially textured epitaxial metal comprising layer on the biaxially textured surface provided by the second buffer layer, and an optional epitaxial buffer layer on the biaxially textured epitaxial metal comprising layer. An electromagnetically or electro-optically active layer, such as a superconductor layer can be disposed on the biaxially textured epitaxial metal comprising layer. The superconductor layer can comprise $REBa_2Cu_3O_7$, wherein RE is a rare earth element, such as Y. The article can comprise a superconductor tape. The article can include a protective layer disposed between the substrate and the first buffer film.

A power cable can comprise a plurality of superconductive tapes, each of the plurality of tapes comprising a substrate, a first buffer layer disposed on the substrate, the first buffer layer having uniaxial crystal texture characterized by out-of-plane texture with no significant in-plane crystallographic texture. A metal comprising second buffer layer is disposed on the first buffer layer, the second buffer layer having a biaxially textured surface. A superconductor layer is disposed on the biaxially textured surface. The power cable can further comprise a conduit for passage of coolant fluid. In this embodiment, the superconductive tapes can be wrapped around the conduit. The power cable can comprise a power transmission cable or a power distribution cable.

A power transformer can comprise a primary winding, and a secondary winding, wherein at least one of the primary winding and secondary winding comprises a wound coil of superconductive tape. The superconductive tape comprises a substrate, a first buffer layer disposed on the substrate, the first buffer layer having uniaxial crystal texture characterized by out-of-plane texture with no significant in-plane crystallographic texture. A metal comprising second buffer layer is disposed on the first buffer layer, the second buffer layer having a biaxially textured surface. A superconductor layer is disposed on the biaxially textured surface. The secondary winding can have fewer windings as compared to the primary winding. Alternatively, for increasing voltage, the primary winding can have a fewer number of windings as compared to the secondary winding.

A power generator comprises a shaft coupled to a rotor comprising electromagnets comprising rotor coils, and a stator comprising a conductive winding surrounding the rotor, wherein at least one of the winding and the rotor coils comprises a superconductive tape. The superconductive tape comprises a substrate, a first buffer layer disposed on the substrate, the first buffer layer having uniaxial crystal texture characterized by out-of-plane texture with no significant in-plane crystallographic texture. A metal comprising second buffer layer is disposed on the first buffer layer, the second buffer layer having a biaxially textured surface. A superconductor layer is disposed on the biaxially textured surface. At least one of the rotor coils can include the superconductive tape.

A power grid comprises a power generation station comprising a power generator, a transmission substation comprising a plurality of power transformers for receiving power from the power generation station and stepping-up voltage for transmission, a plurality of power transmission cables for transmitting power from the transmission substation, a power substation for receiving power from the power transmission cables, the power substation comprising a plurality of power transformers for stepping-down voltage for distribution and a plurality of power distribution cables for distributing power to end users. At least one of the power distribution cables, power transmission cables, transformers of the power substation, transformers of the transmission substation, and the power generator comprises a substrate, a first buffer layer disposed on the substrate, the first buffer layer having uniaxial crystal texture characterized by out-of-plane texture with no significant in-plane crystallographic texture, a metal comprising second buffer layer disposed on the first buffer layer, the second buffer layer having a biaxially textured surface, and a superconductor layer disposed on the biaxially textured surface.

A method of producing a biaxially textured article comprises the steps of providing a substrate, growing a uniaxially textured first buffer film on the substrate. The uniaxial crystal texture is characterized by out-of-plane texture with no significant in-plane crystallographic texture. An epitaxial first metal comprising second buffer film is deposited on the uniaxially textured film. The second buffer film is then bombarded with an ion beam. The ion beam induces in-plane texture in a surface of the second buffer film to form a biaxially textured surface. The method can include the step of epitaxially growing a biaxially textured epitaxial metal comprising film on the biaxially textured surface. The article can comprise a tape.

A superconductor layer can be deposited on the biaxially textured surface. The superconductor layer can provide a Jc of at least 0.5 MA/cm$^2$ at 77 K and self-field.

The first buffer film can have a rock-salt-like crystal structure. The first buffer film can be $REBa_2Cu_3O_7$, $Bi_4Ti_3O_{12}$, MgO, TiN, or NiO, where RE is a rare earth element.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

The invention provides biaxially textured articles and associated articles, devices and systems. The biaxial texture is achieved using separate layers and processes. A first buffer layer generally yields a uniaxial out-of-plane texture with no ion beam, and a second buffer layer generally provides in-plane texture and a surface portion having biaxial texture. The second buffer film generally is large grained as compared to the first buffer film.

The biaxially textured surface portion is achieved irradiation by an energetic ion beam which induces an in-plane texture through selective etching of the surface. An electronically active layer, such as a superconductor layer, can be disposed on the biaxially textured surface. The invention thus eliminates the need of having the entire texture in the buffer layer provided by ion assist processing.

The first buffer layer can achieve a high degree of out-of-plane crystallographic texture through the anisotropic growth habits of selected materials even though the underlying substrate is essentially untextured. Several polycrystalline thin-film materials, including oxides, tend to align a specific crystallographic axis along the surface normal for certain deposition conditions. In terms of anisotropic growth, it is known that several multi-cation oxides (such as $YBa_2Cu_3O_7$ (YBCO), and $Bi_4Ti_3O_{12}$) exhibit strongly c-axis oriented film growth on randomly oriented substrates. Unfortunately, the complex chemistry involved of these compounds makes them unattractive for direct IBAD processing. However, according to the invention, these strongly textured films are used as the initial template for epitaxy of a second buffer layer. Within this application, the first buffer film that produces the strong c-axis texture with no ion assist processing is generally referred to as Layer 1. The second buffer layer that is a metal comprising layer which is initially deposited as an uniaxially textured film is generally referred to as Layer 2. In-plane texture in the surface of Layer 2 is induced due to irradiation with an ion beam to produce a biaxially textured surface. A subsequently deposited biaxially textured metal comprising third buffer film which is preferably disposed on the biaxially textured surface is generally referred to as Layer 3.

Figure 1:
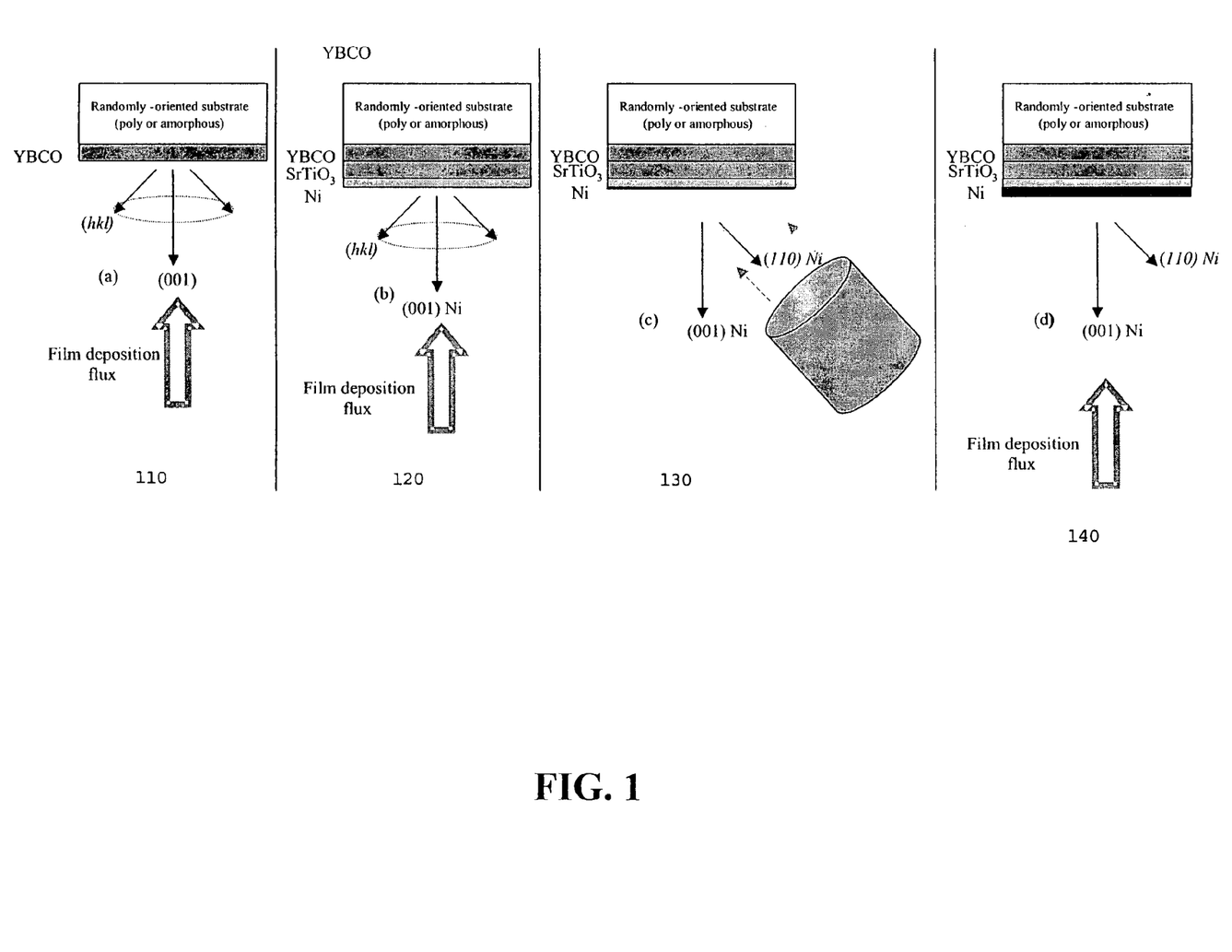
FIG. 1 illustrates steps in a general method for forming biaxially textured articles according to the invention featuring depictions for certain key method steps along with the associated layer stacks present during the particular steps where an ion beam is used to texture a template that is pre-textured with a strong c-axis orientation.

Referring to FIG. 1, steps in an exemplary ion beam comprising process for forming biaxially textured articles according to the invention are shown. In step 110 Layer 1 comprising a layer of YBCO is deposited on a randomly oriented substrate which is polycrystalline or amorphous. As noted above, YBCO is a material which exhibits strongly c-axis (100) oriented film growth on randomly oriented substrates, where (hkl) represents Miller Indicies. In this case, Layer 1 provides uniaxial texture without the need for an ion beam. Following deposition of an optional $SrTiO_3$ epitaxial protective layer on the YBCO layer, in step, 120 Layer 2 comprising a metal that maintains the initial uniaxial texture is epitaxially grown. As shown in FIG. 1, an epitaxial layer of Ni (Layer 2) is deposited on the $SrTiO_3$ protective layer. The epitaxial Ni layer achieves the (100) texture and generally is large grained compared to Layer 1.

In step 130, an ion beam oriented 45 degrees to the (100) etches the surface of the epitaxial Ni layer (Layer 2) to form a biaxially textured surface portion. This subsequent ion beam assisted processing induces an in-plane texture component in the surface portion of Layer 2 that does not exist in the as deposited surface of Layer 2, while still maintaining the strong c-axis texture obtained as deposited. In step 140, an additional Ni layer (Layer 3) is deposited on the biaxially textured surface portion of Layer 2 provided by the ion beam processing. Without the use of the ion beam on the surface of Layer 2, the epitaxial growth of Layer 3 would have only reproduced the uniaxial (100) texture achieved in Layer 2.

The ability to obtain a biaxially textured buffer surface using ion-beam assisted processes can produce high performance articles substantially more efficiently and economically as compared to conventional ion-beam assisted deposition (IBAD) processing. The invention thus eliminates the need of prior IBAD processes which have required IBAD processing to produce biaxial texture in the full buffer layer thickness.

The biaxially textured article obtained using the process shown in FIG. 1 can be used for a variety of devices, some which require additional processing. For example, an additional buffer layer can be deposited on Layer 3 to provide an effective template for biaxially-textured high temperature superconducting oxide growth or other biaxially textured electronically active layers. This invention thus eliminates the need of having the entire texture in the buffer layer determined by the ion assisted process. The invention is particularly suitable for the growth of the high temperature superconducting films with high critical current density, such as in excess of about 0.5 $MA/cm^2$ at about 77 K and self-field, and preferably in excess of about 1 $MA/cm^2$. Embodiments of the invention are also useful for a variety of other electronic applications in which sharp crystallographic texture is important.

The electronically active layer may be a superconductor, a semiconductor, a photovoltaic, a ferroelectric or an optoelectric, or any other electromagnetic device wherein grain boundary control is important. In this regard, aspects of the present invention are particularly suitable for providing high temperature superconductor components, in which the electronically active layer is formed principally of a superconducting material. Aspects of the invention are particularly well suited for the formation of electronically active wire and tape (hereafter a "tape") articles which have biaxial texture. As used herein, the term "tape" refers to an article having an aspect ratio not less than about 1,000, the aspect ratio meaning the ratio of longest dimension (length) to next longest dimension (width). Typically, the aspect ratio is greater than about $10^4$, and even greater than about $10^5$.

Figure 2:
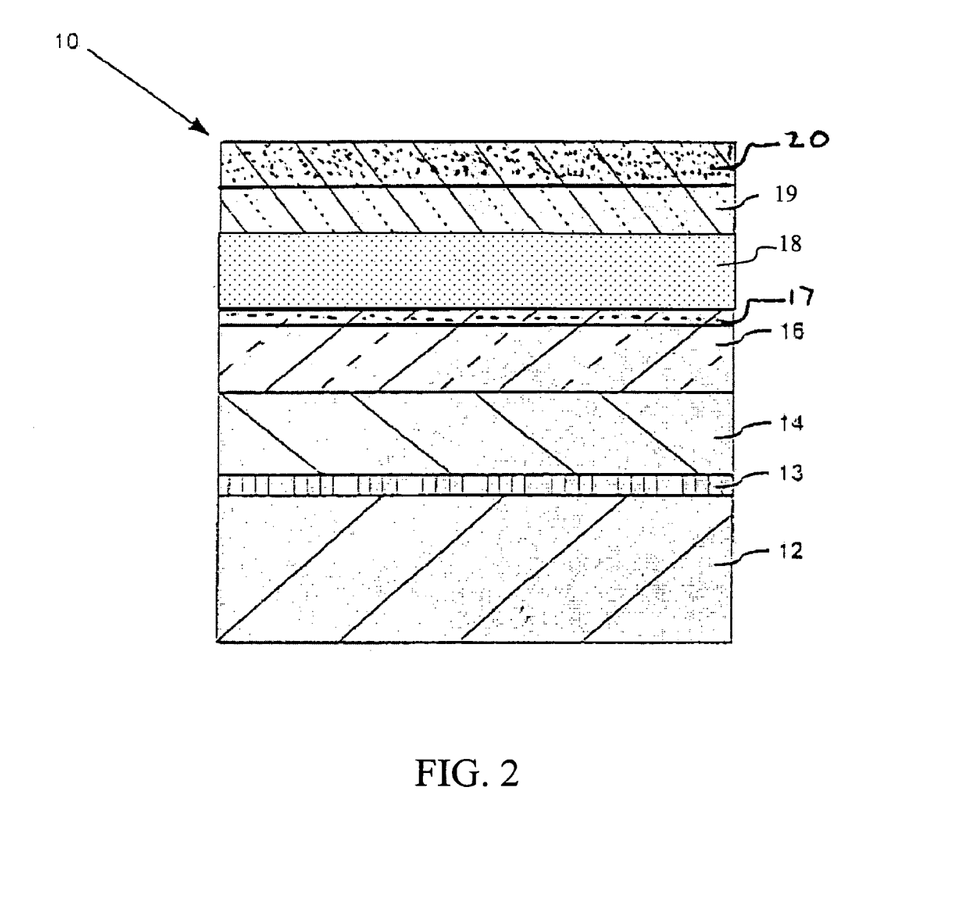
FIG. 2 illustrates a superconducting tape article, according to an embodiment of the invention.

FIG. 2 shows a superconducting tape article 10 according to an embodiment of the invention having a multi-layer composition including a textured superconductor tape 20 having biaxial texture along its entire length. The tape article 10 is expected to be particularly useful for increasing the current carrying capability and reducing AC losses of power transmission lines.

Superconductor article 10 consists of a substrate 12. The substrate can be a metal or polycrystalline ceramic. Alternatively, the substrate can be an alloy, such as the Ni-based alloy Ni—Cr. Texture in the substrate is generally not required. Thus, substrate 12 can be polycrystalline or even amorphous. The substrate 12 provides support for the superconductor article 10, and can be fabricated over long lengths and large areas using the invention. When the superconductor tape is of long length (e.g. 1 km), first and second buffer layers 14 and 16, respectively, may be deposited on substrate surface 12 using a suitable translation process, such as reel-to-reel translation.

Optional protective layer 13 is generally polycrystalline and is disposed on the top surface of substrate 12. Protective layer is preferably used when first buffer layer 14 is chemically incompatible with substrate 12. The polycrystalline protective layer 13 is preferably an oxide, such as cerium oxide or yttria-stabilized zirconia (YSZ).

A second buffer layer 16 is disposed on the first buffer layer 14. Buffer layer 14 is uniaxially textured and generally provides out-of-plane texture and no significant in-plane texture, while second buffer layer 16 is a large-grained metal compared to buffer layer 14. Second buffer layer is uniaxially textured in its bulk and provides a biaxial texture surface portion 17. As described above, surface portion 17 achieves biaxial texture through ion beam bombardment of the surface of second buffer layer 16.

A biaxially textured epitaxial metal comprising layer 18 is disposed on biaxial texture surface portion 17 An optional epitaxial buffer layer 19 is shown disposed on biaxially textured epitaxial metal comprising layer 18. An epitaxial superconducting layer 20 is shown disposed on epitaxial buffer layer 19.

This high degree of out-of-plane texture in first buffer layer 14 can be achieved either through the anisotropic growth habits of selected materials or by preferential selection of energetically favorable growth orientations of selected materials. For example, fist buffer layer 14 can be a polycrystalline material where the energetically favorable growth direction is <100> along the film normal. Examples are rock-salt structures such as MgO and TiN, which have a tendency to align preferentially in the energetically favorable direction of <100> irrespective of the underlying substrate orientation. U.S. Pat. No. 6,190,752 to Do et al. entitled "Thin films having rock-salt-like structure deposited on amorphous surfaces" provides detailed information regarding rock-salt structures and available species.

Several polycrystalline thin-film materials, including various oxides, have anisotropic growth habits as they tend to align a specific crystallographic axis along the surface normal of a substrate for certain deposition conditions. In terms of anisotropic growth, it is known that several multi-cation oxides, such as $REBa_2Cu_3O_7$, where RE is a rare earth element such as $YBa_2Cu_3O_7$, and $Bi_4Ti_3O_{12}$ exhibit strong out of plane (c-axis) oriented film growth on randomly oriented substrates. Unfortunately, the complex chemistry involved with these compounds makes them unattractive for direct IBAD.

However, strongly textured films can be used as first buffer layer 14 which can act as an initial template for epitaxy. First buffer layer 14 generally has a thickness within a range about 100 to about 3000 Angstroms. Buffer layer 14 is preferably aligned along the [001] direction and can be deposited by sputtering, pulsed laser deposition, or evaporation. First buffer layer 14 should have a relatively small grain size, less than approximately 700 nm.

Second buffer layer 16 is a layer in which in-plane texture is induced due to the ion beam bombardment of certain grains which provides selective surface etching. The epitaxial growth of buffer layer 16 on the uniaxial out-of-plane textured buffer layer 14 will reproduce the uniaxial texture achieved in first buffer layer 14. By ion bombardment a biaxially textured surface portion 17 is achieved.

Metal films are chosen for buffer layer 16 as these materials yield relatively large grain sizes, often larger than a few microns. This ion beam bombardment induces an in-plane texture component in surface portion 17 of second buffer layer 16 that does not exist in first buffer layer 14, while still maintaining the strong out-of-plane texture.

The second buffer layer 16 generally has a thickness within a range of about 100 to about 10000 Angstroms. The biaxially textured second buffer layer 16 is preferably aligned along a first axis having along a [001] crystal direction, and along a second axis having a crystal direction selected from the group consisting of [11], [101], [113], [100], and [010]. The second buffer layer 16 can have a cubic crystal structure and comprise Ni, Cu, Ag, Pd, Au, or cubic alloys of these metals. Buffer layer 16 can be deposited by sputtering or evaporation. The thickness of surface portion 17 is generally 1 nm to 100 nm.

Biaxially textured epitaxial metal comprising layer 18 generally has a thickness within a range of about 10 nm to 200 nm and can comprise any cubic metal. Epitaxial buffer layer 19 generally has a thickness within a range of about 10 nm to 20000 nm and can comprise any thin film materials that can be epitaxial on the metal layer 18. These include the perovskites oxide, cubic oxides, the spinel family of oxides, and pyrochlores.

The superconductor layer 20 thickness is generally from 100 to about 3000 nm. Superconductor layer 20 is preferably an oxide superconductor. The oxide superconductor is preferably selected from $REBa_2Cu_3O_7$ where RE is a rare earth element, such as Y, and related compounds. The superconductor article 10 can provide a Jc of at least 0.5 $MA/cm^2$ at 77 K and self-field, and preferably at least 1 $MA/cm^2$.

A general embodiment of the invention involves providing a substrate 12 for film growth. The substrate is cleaned with solvents, such as acetone, methanol, and trichloroethylene. The substrate 12 is mounted in a deposition chamber suitable for thin film deposition. A polycrystalline protective layer 13 is then optionally deposited on the substrate 12. The polycrystalline layer 13 prevents a chemical reaction from occurring between first buffer layer 14 (Layer 1) and the substrate 12.

The protective layer coated substrate is heated in an ambient suitable for the deposition of an anisotropic thin film or a thin film whose energetically favorable growth direction is <100> (layer 1). Layer 1 is then deposited and provides strong out-of-plane (c-axis) texture without the need for ion assist. In order to protect from decomposition or chemical reaction of the first buffer layer 14, and epitaxial capping layer (not shown) can be deposited between the first buffer layer 14 and the second buffer layer 16. The epitaxial capping layer, such as $SrTiO_3$, should be chemically compatible with first buffer layer 14 and second buffer layer 16.

The Layer 1 coated substrate is then transferred to a thin-film deposition system where second buffer layer 16 (Layer 2) achieves the uniaxial texture of Layer 1, such as using a vacuum deposition without an ion beam to initiate epitaxy. Following growth of Layer 2, ion beam bombardment is directed along a preferred crystallographic direction of the material constituting Layer 2 to induce in-plane texture at the surface of Layer 2 to form surface portion 17.

As noted above, the invention is useful for a wide variety of applications, particularly superconductor applications. Regarding superconductor applications, the invention can be used to form high temperature superconducting wires or tapes which can be used for transmission lines, motors, generators, or high-field magnet applications.

Figure 3:
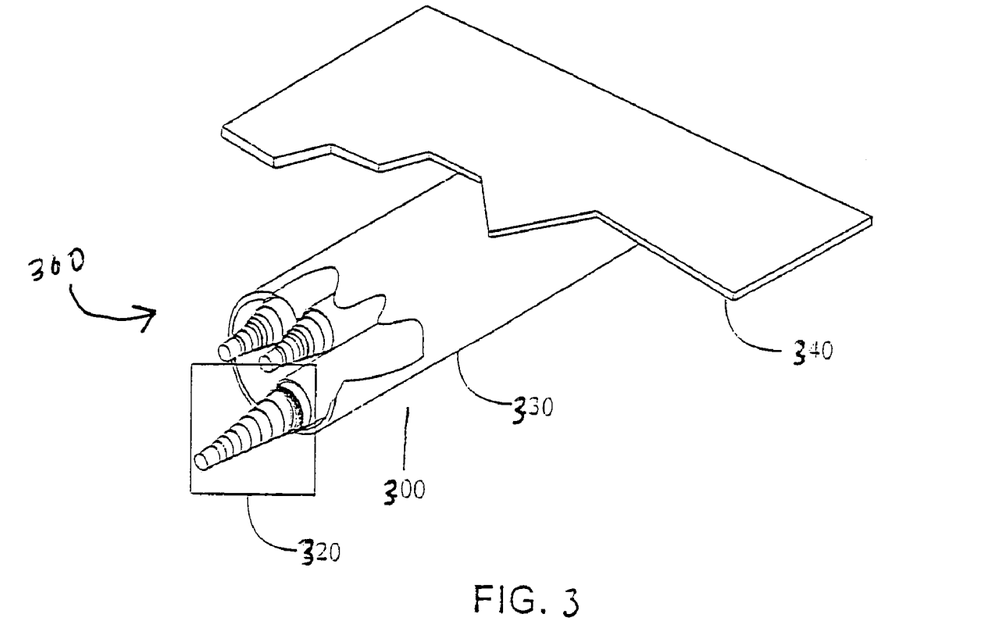
FIG. 3 illustrates a power cable, according to an embodiment of the invention.

FIG. 3 illustrates a power cable 300, according to an embodiment of the invention. Power cable 300 includes three superconducting cables 320 arranged in a trefoil (or triaxial) arrangement where all three phases are housed in the same thermally insulating conduit 330. Ground plane 340 is also provided. The phases are situated as close together as physically possible. Although not shown, other arrangements are possible, including a concentric arrangement where the 3 cables are situated concentrically.

Figure 4:
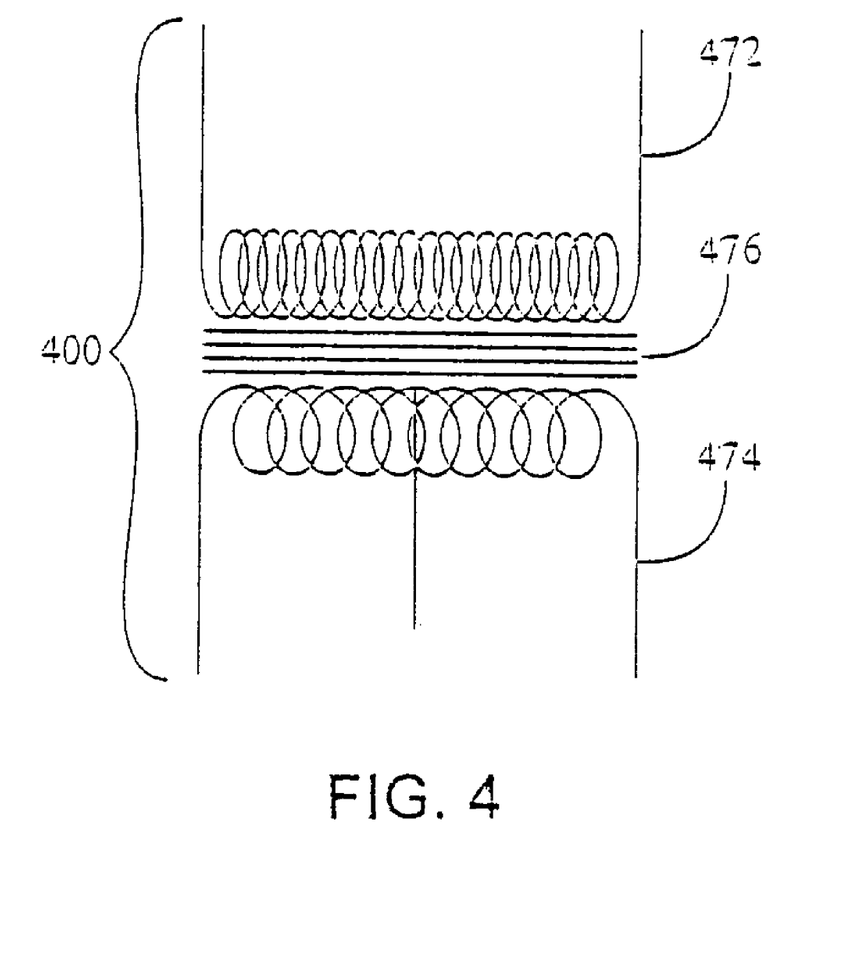
FIG. 4 illustrates power transformer, according to another embodiment of the invention.

FIG. 4 illustrates power transformer 400, according to another embodiment of the invention. Power transformer 400 includes a primary winding 472, a secondary winding 474 and core 476. At least one of the primary winding 472 and secondary winding 474 comprises a wound coil of superconductive tape as described above embedded in an insulating material such as epoxy. The secondary winding 474 can have fewer or more windings as compared to the primary winding 472.

Figure 5:
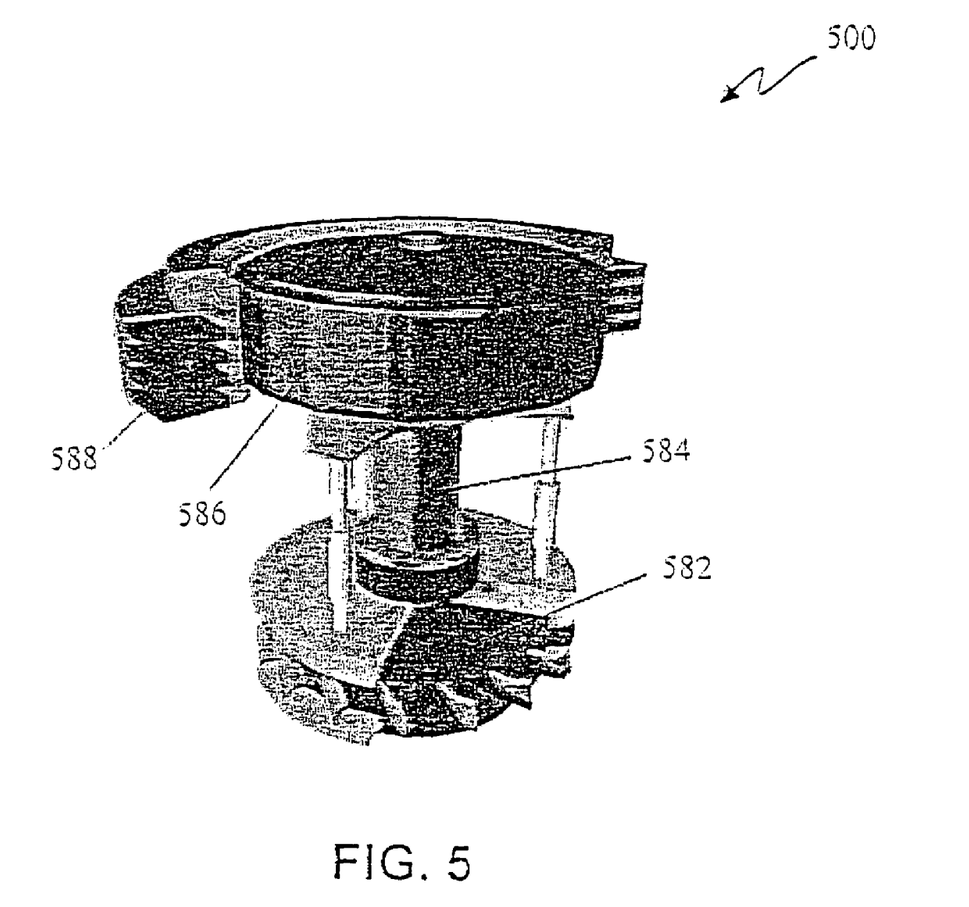
FIG. 5 illustrates power generator, according to an embodiment of the invention.

FIG. 5 illustrates power generator 500, according to an embodiment of the invention. Power generator 500 includes a turbine 582 and a shaft 584 coupled to a rotor 586 comprising electromagnets comprising rotor coils, and a stator 588 comprising a conductive winding surrounding the rotor, wherein at least one of the winding and the rotor coils comprises a superconductive tape as described above.

Figure 6:
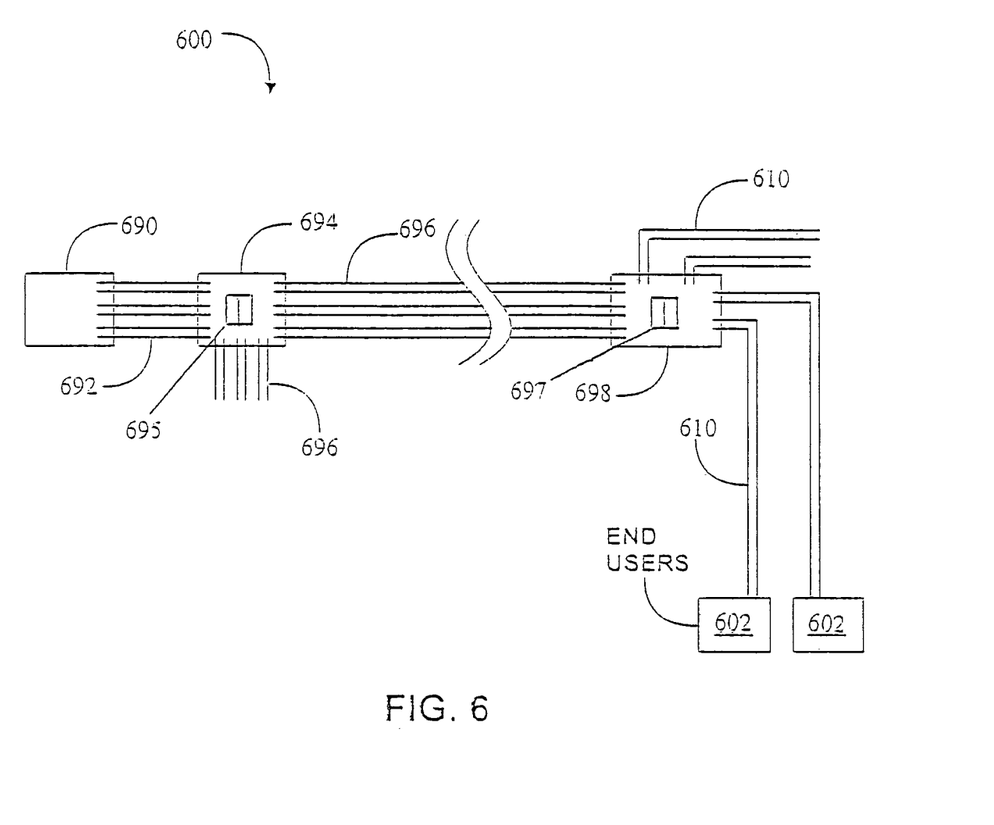
FIG. 6 illustrates a power grid, according to another embodiment of the invention.

FIG. 6 illustrates a power grid 600, according to another embodiment of the invention. Power grid 600 includes a power generation station comprising a power generator plant 690 and transmission lines 692 to deliver power to transmission substation 694. Transmission substation 694 includes transformers 695. Power transmission cables 696 emanate from transmission substation 694. Power transmission cables 696 deliver power from transmission substation 694 to power substation 698 which includes a plurality of power transformers 697 for stepping-down voltage for distribution. Power distribution cables 610 deliver power from power substation 698 to end users 602. At least one of the power distribution cables 610, power transmission cables 696, transformers 697 of the power substation 698, transformers of the transmission substation 695, and the power generator plant 690 comprise a plurality of superconductive tapes as described above.

EXAMPLES

The present invention is further illustrated by the following specific Examples, which should not be construed as limiting the scope or content of the invention in any way.

Example 1

A specific embodiment of the invention via a prophetic example is as follows. An amorphous silicon nitride substrate surface is provided for film growth. The substrate is cleaned with solvents, such as acetone, methanol, and trichloroethylene. The substrate is mounted in a pulsed-laser deposition chamber for thin film deposition. A polycrystalline yttria-stabilized zirconia (YSZ) buffer layer is deposited on the substrate using pulsed laser deposition at 25-600. ° C. in vacuum. This layer serves to prevent chemical reaction between layer 1 and the substrate.

The buffered substrate is heated to 700° C. in vacuum for the deposition of an $YBa_2Cu_3O_7$ thin film (Layer 1). An $YBa_2Cu_3O_7$ film of thickness 700 nm is deposited at 700° C. in 200 mTorr of oxygen. The film is c-axis oriented, but randomly oriented in-plane. The substrate is heated to a temperature suitable for the epitaxial growth of $SrTiO_3$ on $YBa_2Cu_3O_7$ as an epitaxial capping layer for $YBa_2Cu_3O_7$. The substrate is then transferred to a thin-film deposition system equipped with an ion gun to form a Ni film having a biaxially textured surface (Layer 2).

The substrate is heated to a temperature suitable for the epitaxial growth of Ni on $SrTiO_3$. E-beam evaporation is employed to deposit epitaxial Ni on the $SrTiO_3$ template. The Ni layer as deposited will be (001) textured (uniaxial) and small grained. This is followed by bombardment with an Ar ion beam, which is directed along either the [111] or [110] crystallographic direction relative to the (001) surface normal. A subsequent biaxially textured epitaxial Ni layer is then grown on the surface without the need for ion beam processing.

Example 2

A Ni-based alloy substrate is provided for film growth. The substrate is cleaned with solvents, such as acetone, methanol, and trichloroethylene. The substrate is mounted in a pulsed-laser deposition chamber for thin film deposition. A MgO film of thickness 100 nm (Layer 1) is deposited at 25 C in vacuum. The MgO layer will be (001) textured. The coated substrate is then transferred to a thin-film deposition system equipped with an ion gun. A layer of Pd (Layer 2) is grown, first without the ion beam. After deposition of the Pd layer, an Ar ion beam is directed along either the [111] or [110] crystallographic direction of Pd. The surface of the Pd layer (Layer 2) will become biaxially textured.

Example 3

Figure 7:
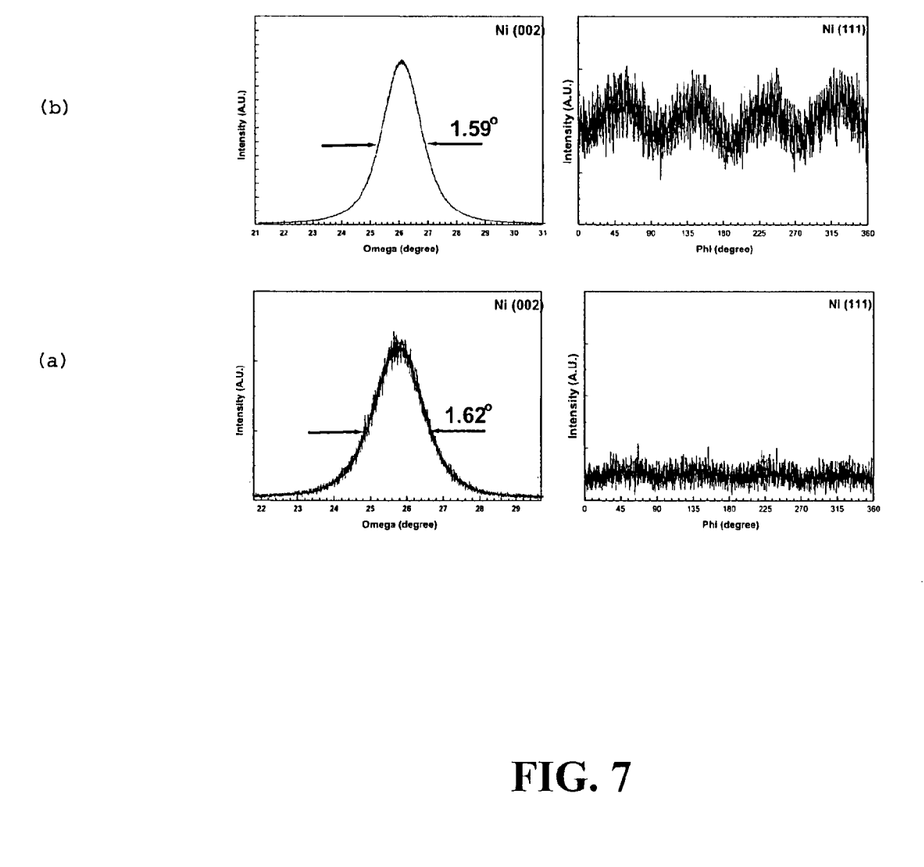
FIGS. 7(a) and 7(b) show omega and phi scans before and after epitaxial growth of a biaxially textured Ni layer grown on an ion beam induced biaxially textured Ni surface.

FIGS. 7(a) and (b) shows omega and phi scans demonstrating biaxial texture both before and after epitaxial growth of a Ni layer on an ion beam induced biaxially textured Ni surface, respectively. Referring again to FIG. 1, the data shown in FIG. 7(a) corresponds to data taken from the Ni surface following ion beam processing in step 130. The ion beam processing comprised an Ar beam ($Ar^+$) oriented at 45 degrees to the surface to be etched at 400° C. for 20 minutes. The additional Ni layer was deposited at 500° C. for 1 hour after surface etching for 20 minutes at 400° C. with the ion beam. The data shown in FIG. 7(b) corresponds to data taken from the Ni surface deposited in step 140 shown in FIG. 1. The four peaks indicate that the film is in-plane textured as a result of the Ar ion beam treatment.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

We claim:

1. A biaxially textured article, comprising:
   a substrate;
   a first buffer layer disposed on said substrate, said first buffer layer having uniaxial crystal texture characterized by out-of-plane texture with no significant in-plane crystallographic texture, and
   a metal comprising second buffer layer disposed on said first buffer layer, said second buffer layer having a biaxially textured surface, wherein said second buffer layer is a metal having a cubic crystal structure.

2. The article of claim 1, wherein said first buffer film is aligned along the [001] crystal direction.

3. The article of claim 1, wherein said out-of-plane crystallographic texture provides a mosaic spread of no more than 30 degrees.

4. The article of claim 1, wherein said first buffer film has a rock-salt-like crystal structure.

5. The article of claim 1, wherein said first buffer film is at least one selected from the group consisting of $REBa_2Cu_3O_7$, $Bi_4Ti_3O_{12}$, MgO, TiN, and NiO, where RE is a rare earth element.

6. The article of claim 1, wherein said substrate comprises a metal alloy.

7. The article of claim 1, wherein said substrate has no significant texture.

8. The article of claim 1, wherein said biaxially texture surface is aligned along a first axis having along a [001] crystal direction, and along a second axis having a crystal direction selected from the group consisting of [111], [101], [113], [100] and [010].

9. The article of claim 1, wherein said second buffer layer comprises at least one material from the group consisting of Ni, Cu, Au, Ag, Pd, or related alloys.

10. The article of claim 1, further comprising a biaxially textured epitaxial metal comprising layer on said biaxially textured surface.

11. The article of claim 10, further comprising an epitaxial buffer layer on said biaxially textured epitaxial metal comprising layer.

12. The article of claim 11, further comprising an electromagnetically or electro-optically active layer disposed on said biaxially textured epitaxial buffer layer.

13. The article of claim 12, wherein said electromagnetically or electro-optically active layer comprises a superconductor layer.

14. The article of claim 13, wherein said superconductor layer comprises $REBa_2Cu_3O_7$, wherein RE is a rare earth element.

15. The article of claim 14, wherein RE comprises Y.

16. The article of claim 14, wherein said article comprises a superconductor tape.

17. The article of claim 1, further comprising a protective layer disposed between said substrate and said first buffer film.

18. A power cable, comprising:
a plurality of superconductive tapes, each of said plurality of tapes comprising a substrate, a first buffer layer disposed on said substrate, said first buffer layer having uniaxial crystal texture characterized by out-of-plane texture with no significant in-plane crystallographic texture;
a metal comprising second buffer layer disposed on said first buffer layer, said second buffer layer comprising a biaxially textured surface, wherein said second buffer layer is a metal having a cubic crystal structure, and
a superconductor layer disposed on said biaxially textured surface.

19. The power cable of claim 18, further comprising a conduit for passage of coolant fluid.

20. The power cable of claim 19, wherein said superconductive tapes are wrapped around said conduit.

21. The power cable of claim 18, wherein said power cable comprises a power transmission cable or a power distribution cable.

22. A power transformer, comprising:
a primary winding; and
a secondary winding, wherein at least one of the primary winding and secondary winding comprises a wound coil of superconductive tape, said superconductive tape comprising a substrate, a first buffer layer disposed on said substrate, said first buffer layer having uniaxial crystal texture characterized by out-of-plane texture with no significant in-plane crystallographic texture;
a metal comprising second buffer layer disposed on said first buffer layer, said second buffer layer comprising a biaxially textured surface, wherein said second buffer layer is a metal having a cubic crystal structure, and
a superconductor layer disposed on said biaxially textured surface.

23. The power transformer of claim 22, wherein said secondary winding has fewer windings as compared to said primary winding.

24. The power transformer of claim 22, wherein said primary winding has fewer number of windings than said secondary winding, for increasing voltage.

25. A power generator, comprising:
a shaft coupled to a rotor comprising electromagnets comprising rotor coils; and
a stator comprising a conductive winding surrounding the rotor, wherein at least one of said winding and said rotor coils comprises superconductive tape, said superconductive tape comprising:
a substrate;
a first buffer layer disposed on said substrate, said first buffer layer having uniaxial crystal texture characterized by out-of-plane texture with no significant in-plane crystallographic texture;
a metal comprising second buffer layer disposed on said first buffer layer, said second buffer layer comprising a biaxially textured surface, wherein said second buffer layer is a metal having a cubic crystal structure, and
a superconductor layer disposed on said biaxially textured surface.

26. The power generator of claim 25, wherein at least one of said rotor coils contain said superconductive tape.

27. A power grid, comprising:
a power generation station comprising a power generator;
a transmission substation comprising a plurality of power transformers for receiving power from the power generation station and stepping-up voltage for transmission;
a plurality of power transmission cables for transmitting power from the transmission substation;
a power substation for receiving power from the power transmission cables, said power substation comprising a plurality of power transformers for stepping-down voltage for distribution; and
a plurality of power distribution cables for distributing power to end users, wherein at least one of the power distribution cables, power transmission cables, transformers of the power substation, transformers of the transmission substation, and the power generator comprises:
a substrate, a first buffer layer disposed on said substrate, said first buffer layer having uniaxial crystal texture characterized by out-of-plane texture with no significant in-plane crystallographic texture;
a metal comprising second buffer layer disposed on said first buffer layer, said second buffer layer comprising a biaxially textured surface, wherein said second buffer layer is a metal having a cubic crystal structure, and
a superconductor layer disposed on said biaxially textured surface.

28. A method of producing a biaxially textured article, comprising the steps of:
providing a substrate;
growing a uniaxially textured first buffer film on said substrate, said uniaxial crystal texture characterized by out-of-plane texture with no significant in-plane crystallographic texture,
depositing an epitaxial first metal comprising second buffer film on said uniaxially textured film, and
bombarding said second buffer film with an ion beam, wherein said ion beam induces in-plane texture in a surface of said second buffer film to form a biaxially textured surface,
wherein said second buffer layer comprises a biaxially textured surface, wherein said second buffer layer is a metal having a cubic crystal structure.

29. The method of claim 28, further comprising the step of epitaxially growing a biaxially textured epitaxial metal comprising film on said biaxially textured surface.

30. The method of claim 28, further comprising the step of depositing a superconductor layer on said biaxially textured surface.

31. The method of claim 30, wherein said superconductor layer provides a Jc of at least 0.5 $MA/cm^2$ at 77 K and self-field.

32. The method of claim 28, wherein said first buffer film has a rock-salt-like crystal structure.

33. The method of claim 28, wherein said first buffer film is at least one selected from the group consisting of $REBa_2Cu_3O_7$, $Bi_4Ti_3O_{12}$, MgO, TiN, and NiO, where RE is a rare earth element.

34. The method of claim 33, wherein said article comprises a tape.

35. A biaxially textured article, comprising:
a substrate;
a first buffer layer disposed on said substrate, said first buffer layer having uniaxial crystal texture characterized by out-of-plane texture with no significant in-plane crystallographic texture, and
a metal comprising second buffer layer disposed on said first buffer layer, said second buffer layer comprising the uniaxial crystal texture of the first buffer layer and a biaxially textured surface, wherein said second buffer layer is a metal having a cubic crystal structure.

36. The article of claim 35, wherein said second buffer layer comprises at least one material from the group consisting of Ni, Cu, Au, Ag, Pd, or related alloys.

* * * * *